United States Patent
Pal

(10) Patent No.: US 9,531,170 B2
(45) Date of Patent: Dec. 27, 2016

(54) INTERCONNECTS FOR ELECTRICAL POWER DISTRIBUTION SYSTEMS

(71) Applicant: Hamilton Sundstrand Corporation, Charlotte, NC (US)

(72) Inventor: Debabrata Pal, Hoffman Estates, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 176 days.

(21) Appl. No.: 14/338,312

(22) Filed: Jul. 22, 2014

(65) Prior Publication Data
US 2016/0028216 A1    Jan. 28, 2016

(51) Int. Cl.
| | |
|---|---|
| H01R 25/00 | (2006.01) |
| H05K 7/00 | (2006.01) |
| H02B 1/56 | (2006.01) |
| H01H 9/52 | (2006.01) |
| H01H 85/47 | (2006.01) |
| H01R 4/62 | (2006.01) |
| H01R 25/16 | (2006.01) |
| H02G 5/10 | (2006.01) |

(52) U.S. Cl.
CPC ............... *H02B 1/56* (2013.01); *H01H 9/52* (2013.01); *H01H 85/47* (2013.01); *H01R 4/625* (2013.01); *H01R 25/162* (2013.01); *H02G 5/10* (2013.01); *H05K 7/00* (2013.01)

(58) Field of Classification Search
CPC .. H01R 9/24–9/2608; H02B 1/56; H02B 1/20; B60M 1/30–1/34; H02G 5/00; H02G 5/002; H02G 5/10
USPC ....... 361/601, 605, 611, 614, 624, 634, 637, 361/648, 650, 676; 174/16.2, 68.2, 71 B, 174/72 B, 88 B; 165/80.2, 80.3, 181, 182
See application file for complete search history.

(56) References Cited

U.S. PATENT DOCUMENTS

| | | | | |
|---|---|---|---|---|
| 3,879,100 | A * | 4/1975 | Chabot | H01H 71/08 165/182 |
| 4,121,276 | A * | 10/1978 | Kovatch | H02B 1/21 174/71 B |
| 6,018,455 | A * | 1/2000 | Wilkie, II | H02B 1/21 165/80.3 |
| 7,837,496 | B1 * | 11/2010 | Pal | H01R 9/2466 361/712 |
| 2002/0122289 | A1 | 9/2002 | Meiners et al. | |

(Continued)

FOREIGN PATENT DOCUMENTS

| | | | | |
|---|---|---|---|---|
| DE | 102009033370 A1 * | 2/2011 | ............ | B60M 1/305 |
| DE | 102009033370 A1 | 2/2011 | | |

OTHER PUBLICATIONS

Search Report for corresponding European Application No. 15177902.2 dated Nov. 9, 2015.

*Primary Examiner* — Courtney Smith
*Assistant Examiner* — Zhengfu Feng
(74) *Attorney, Agent, or Firm* — Locke Lord LLP; Scott D. Wofsy; Christopher J. Cillié

(57) ABSTRACT

A contactor interconnect includes a lead post, a bus bar post and a plurality of electrically conductive heat rejection components. The lead post electrically connects to the bus bar post in series through the plurality of heat rejection components. The heat rejection components in turn connect electrically in parallel with one another between the lead post and the bus bar post for conducting current between the posts and passively dissipating heat conveyed from the lead post toward the bus bar post.

15 Claims, 5 Drawing Sheets

(56) References Cited

U.S. PATENT DOCUMENTS

2006/0027390 A1   2/2006  Suzuki et al.

* cited by examiner

INTERCONNECTS FOR ELECTRICAL POWER DISTRIBUTION SYSTEMS

BACKGROUND OF THE INVENTION

1. Field of the Invention

The present disclosure relates to power distribution systems, and more particularly to interconnects for coupling contactors and bus bars.

2. Description of Related Art

Aircraft generally include onboard power systems with power generation devices connected to power distribution systems. The power generation system generates electrical power and the power distribution system routes the power from the power generation device to one or more power consuming devices or subsystems for powering onboard electronic systems. Such power generation systems typically include electrical contactors that control power flow through the power distribution systems. The contactors in turn control the flow of current between electrically opposed bus bars, typically through a movable element or relay device.

Contactors can generate heat due to current flow through the conductive elements of the contactor and the power distribution system. Generally, heat is conducted out the contactor leads extending through the contactor housing, into power distribution bus bars connected to the leads, and from the bus bars into the ambient atmosphere. In some power distribution systems, heat dissipation requirements can require sizing the bus bars beyond the size otherwise necessary for conducting electrical current. It can also require forming the bus bars from a heavier material than otherwise necessary, like copper or copper alloy, instead of aluminum or similar material.

Such conventional methods and systems have generally been considered satisfactory for their intended purpose. However, there is still a need in the art for improved contactors and contactor connection devices. The present disclosure provides a solution for this need.

SUMMARY OF THE INVENTION

A contactor interconnect includes a lead post, a bus bar post and a plurality of electrically conductive heat rejection components. The plurality of heat rejection components electrically connects the lead post to the bus bar post. The plurality of heat rejection components are arranged electrically in parallel with one another between the lead post and the bus bar post for conducting current between the posts and passively dissipating heat conveyed from the lead post toward the bus bar post.

In certain embodiments each heat rejection component can include upper and lower heat rejection surfaces that extend between the lead post and bus bar post. Opposed lower and upper heat rejection surfaces adjacent ones of the heat rejection components can define respective coolant flow passages extending therebetween for removing heat from the heat rejection component. Heat can be removed using an active and/or passive coolant flow. Heat can be rejected in a flow direction that is angled with respect current flow through the interconnect, such as at a 90 degree or any other suitable angle.

In accordance with certain embodiments, at least one of the heat rejection components can include a first and a second layer extending between the lead post and the bus bar post, wherein the first layer is integral with the second layer. The first layer can be ultrasonically welded to the second layer. At least one of the first and second layers can extend into at least one of the lead and bus bar posts.

It is contemplated that a third layer can be formed from a material that is different from the materials forming either or both the first and second layers. The third layer can be integral with the heat rejection component first and second layers. The third layer can form a portion of the at least one of the lead post and bus bar post. The third layer can also define a portion of a separation distance between opposed lower and upper heat rejection surfaces of adjacent heat rejection components. The third layer can connect the first and second layers of the heat rejection component with a bus bar for an aircraft power distribution system. The third layer can be ultrasonically welded to the first layer, to the second layer, to the contactor lead, or to the bus bar so as to be integral therewith.

A power distribution system includes a contactor with a lead and an interconnect as described above. The lead can be a first phase lead, the interconnect can be a first phase interconnect, the bus bar post can be a first phase bus bar post, and the power distribution can further include a second phase interconnect coupling a second phase contactor lead to a second phase bus bar lead.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
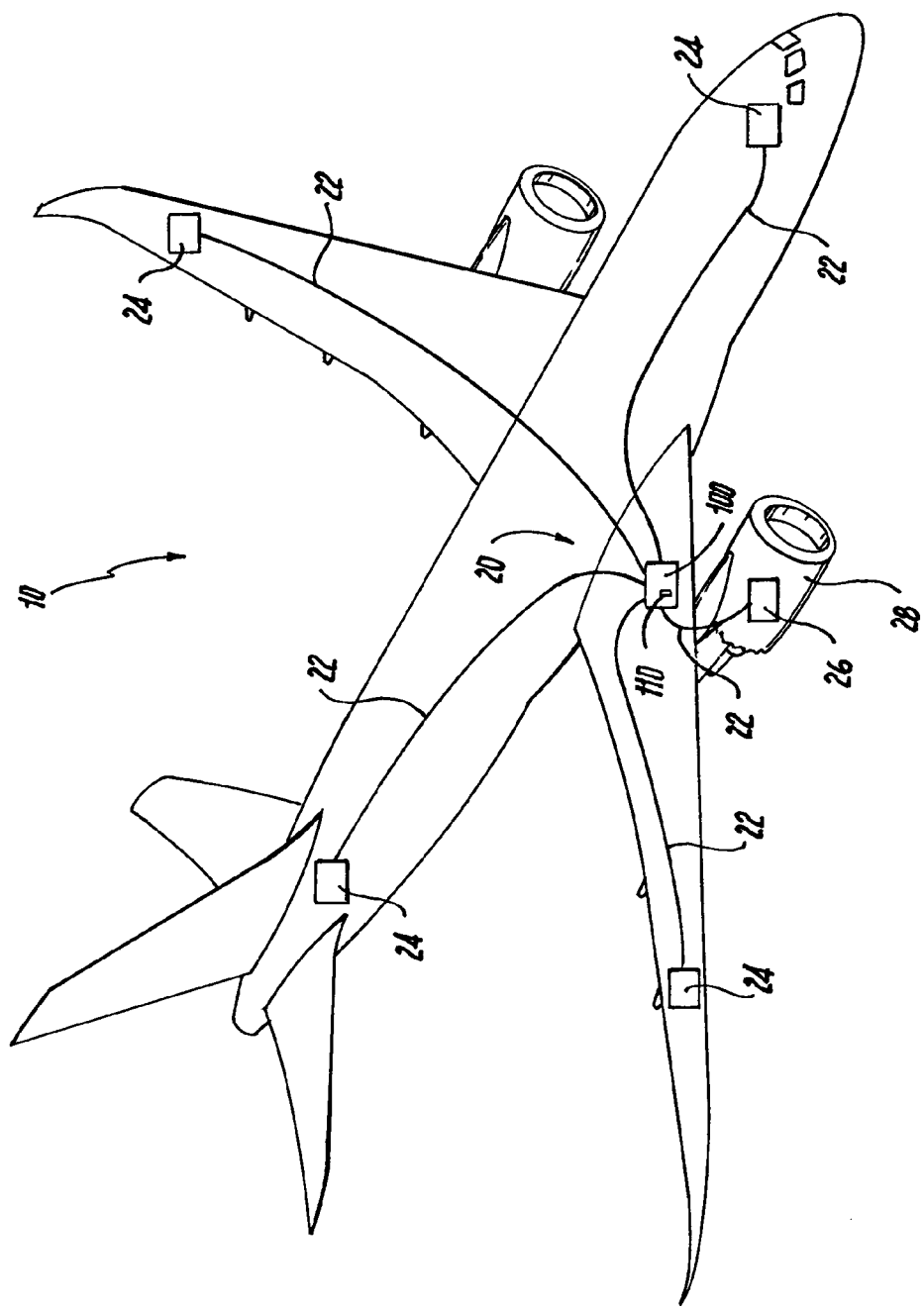
FIG. 1 is a schematic view of an exemplary embodiment of an aircraft constructed in accordance with the present disclosure, showing a power distribution system.

Reference will now be made to the drawings wherein like reference numerals identify similar structural features or aspects of the subject disclosure. For purposes of explanation and illustration, and not limitation, a partial view of an exemplary embodiment of an aircraft electrical system including power distribution system in accordance with the disclosure is shown in FIG. 1 and is designated generally by reference character 20. Other embodiments of interconnects in accordance with the disclosure, or aspects thereof, are provided in FIGS. 2-5, as will be described. The systems and methods described herein can be used in electric power distribution systems, such as aircraft primary power distribution systems for example.

With reference to FIG. 1, aircraft 10 is shown including a power distribution system 20 with a power distribution panel 100 and an interconnect 110, a power bus 22, power consuming devices 24, and a power source 26. Power bus 22 connects power-consuming devices 24 with power source 26 through power distribution panel 100 and interconnect 110. In certain embodiments power bus 22 is a component of an aircraft primary power system. Power-consuming devices 24 include, for purpose illustration and not for purposes of limitation, aircraft components such as control electronics, motor controllers, electric motors, and de-icing systems. Power source 26 is a generator coupled to a prime mover 28, such as an aircraft main engine or auxiliary engine, and receives mechanical rotation therefrom for purpose generating a supply of multiphase current. It is to be understood that, in embodiments, power distribution system is a dual phase or a single-phase, i.e. direct current, power distribution system.

Figure 2:
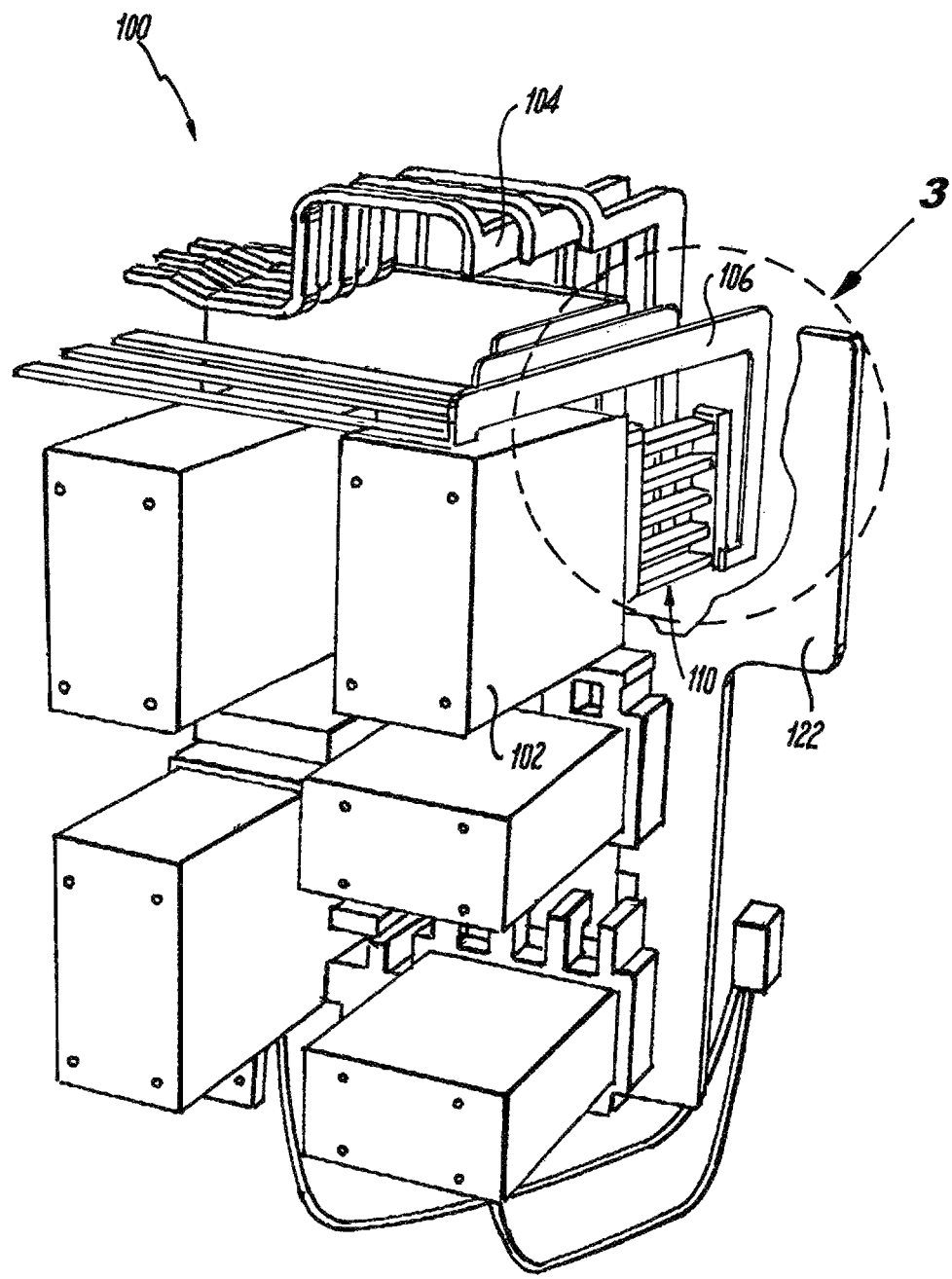
FIG. 2 is a perspective view of a power distribution panel of the power distribution system of FIG. 1, showing a contactor, bus bar and interconnect coupling the contactor and bus bar.

With reference to FIG. 2, an internal portion power distribution panel 100 is shown. Power distribution panel 100 includes a contactor 102 connected between generator-side bus bars 104 and power-consuming device bus bars 106 by an interconnect 110. Contactor 102 and interconnect 110 are mounted to power distribution panel 100 by an epoxy plate 121. Epoxy plate 121 can be formed from a material similar to that of the underlying printed wire board, such as a glass and epoxy laminate material, and is configured and adapted for controlling current through the power distribution system 20 by switching an internal mechanical relay, transistors, or a combination thereof (not shown in FIG. 2 for clarity purposes) between on and off-states. When in the off-state, substantially no current flows from generator-side bus bar 104 to power-consuming device bus bar 106. When in the on-state, current flows from generator-side bus bar 104 to power-consuming device bus bar 106 through interconnect 110.

Current flow through contactor 102 generally results in the generation of heat due to resistive heating the internal relay or transistors within contactor 102. In conventional systems this heat typically dissipates to the ambient environment through the power distribution panel at a rate sufficient to ensure reliable operation of the power distribution system. In certain types of power distribution panels, heat generated by the contactor dissipates through a circuitous path including one or more contactor leads, interconnects, and bus bars. The bus bars in turn transfer the heat to the ambient air by convection and/or radiation. Depending on the amount of heat generated by the contactors, conventional power panels can include forced convection to dissipate heat. Alternatively or additionally, the bus bars can be sized or include material suitable for operation at elevated temperature to maintain an elevated temperature gradient suitable for transferring heat to the ambient environment. While satisfactory for its intended purpose, the heat rejection requirements for conventional bus bars can require that the bus bars be oversized. The heat rejection requirement can also render conventional bus bars heavier than otherwise necessary, make the bus bars more complex, or require fans and ductwork for forced air cooling systems.

Figure 3:
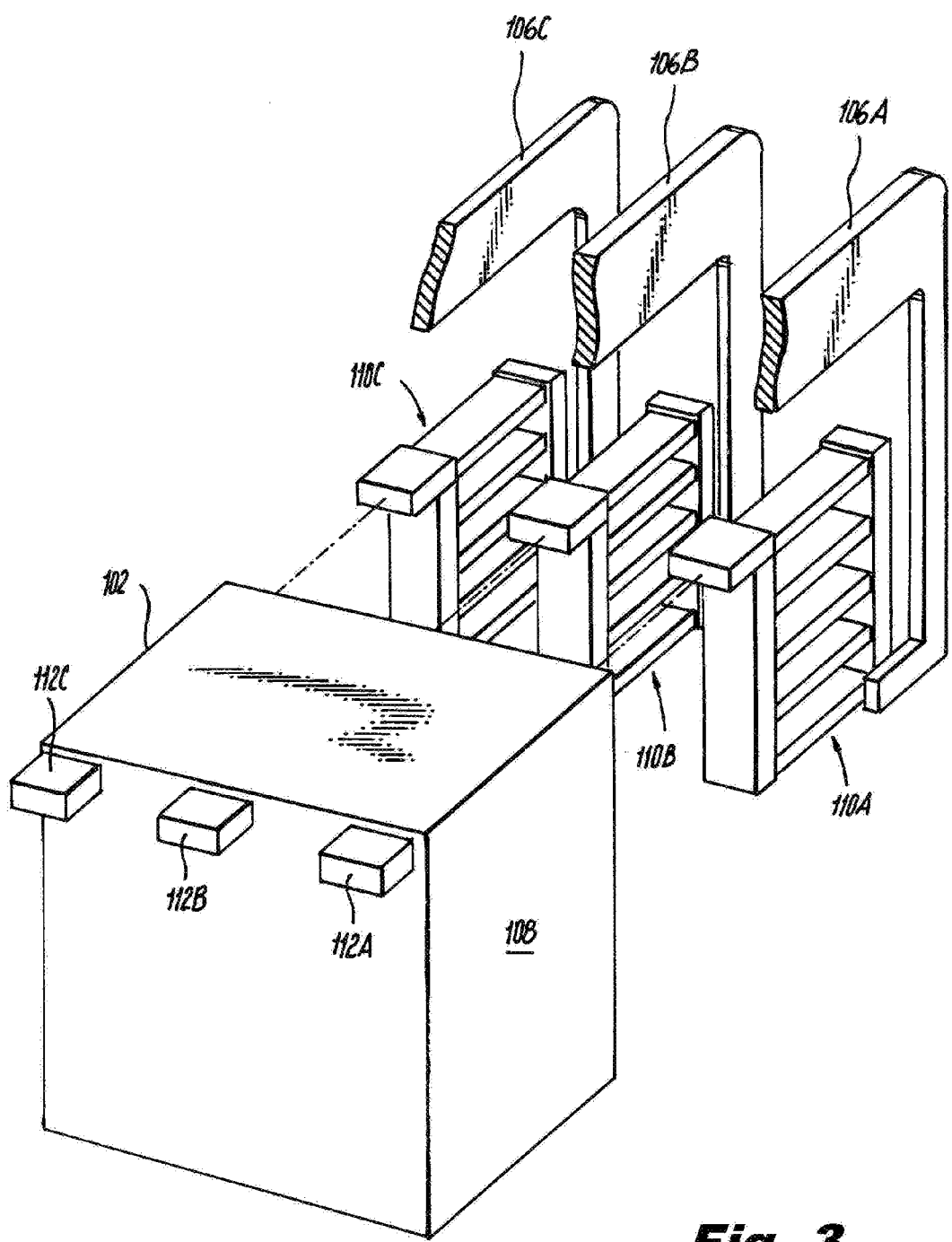
FIG. 3 is a schematic view of the contactor of FIG. 2, showing a multiphase contactor connected between bus bars of a multiphase power distribution system

With reference to FIG. 3, contactor 102 is shown. Contactor 102 includes a housing 108, generator-side leads 112 and power-consuming device leads 114 (shown in FIG. 4). Interconnects 110 couple generator-side leads 112 to power-consuming device bus bars 106 through contactor 102. As illustrated, contactor 102 is a three-phase contactor with an A phase, a B phase, and a C phase, (e.g. a first phase, a second phase, and a third phase) with reference numeral suffixes identifying respective phases. It is to be understood that embodiments of the devices described herein can be used in other types of applications, such as dual phase or single-phase applications.

Figure 4:
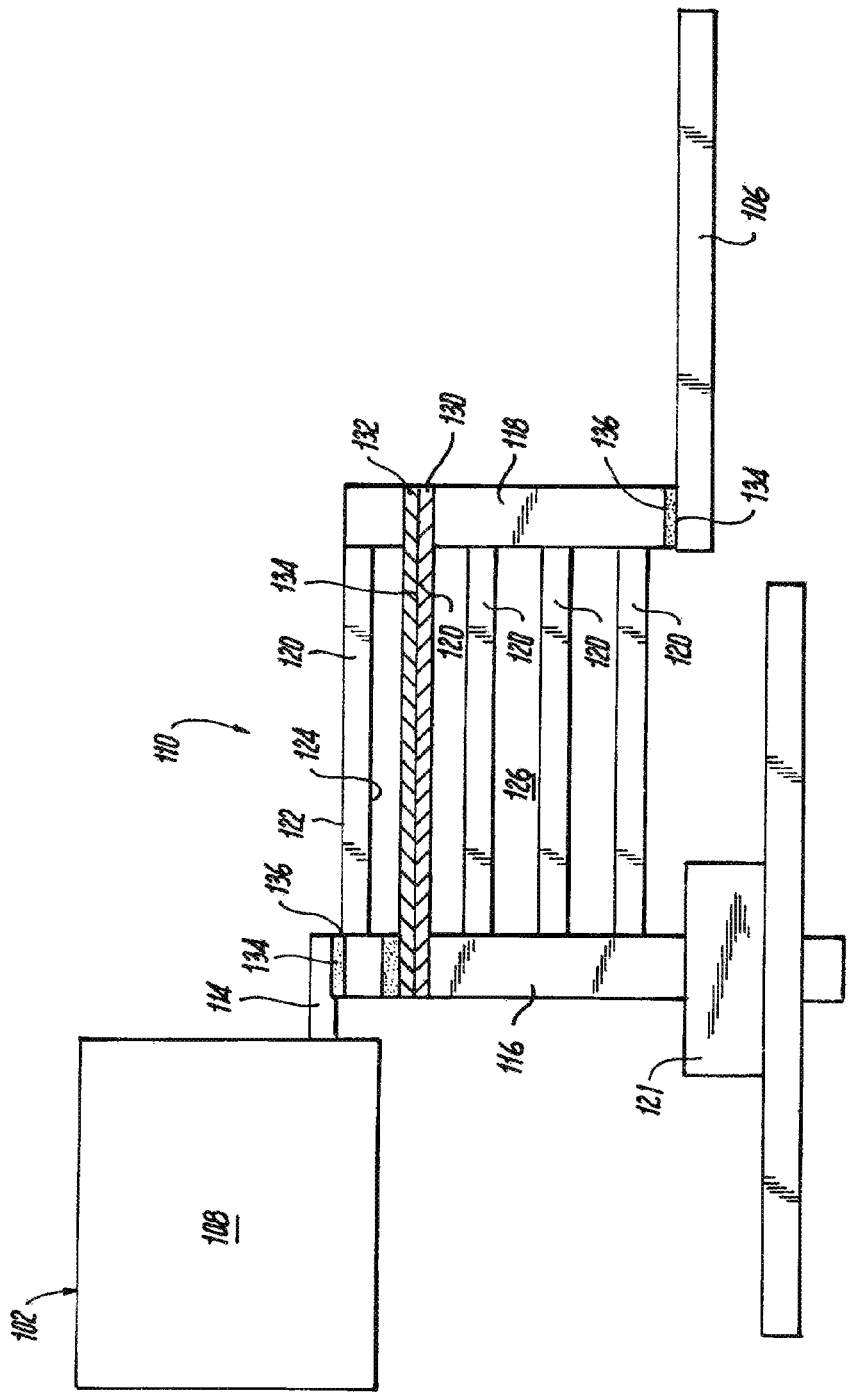
FIG. 4 is schematic side elevation view of the contactor, interconnect, and bus bar of FIG. 3; showing the interconnect lead post, heat rejection components, and bus bar post.

With reference to FIG. 4, interconnect 110 is shown in a schematic side view. Interconnect 110 includes a lead post 116, a bus bar post 118, and a plurality of electrically conductive heat rejection components 120. Heat rejection components 120 for a cooling fin structure connected between lead post 116 and bus bar post 118. Lead post 116 in turn connects contactor 102 through power-consuming device lead 114. Bus bar post 118 connects to power-consuming device bus bar 106. Epoxy plate 121 lead post 116 and provides structural support for the illustrated assembly including contactor 102. As illustrated, heat rejection components 120 are geometrically parallel with one another and orthogonal with respect to lead post 116 and bus bar post 118.

Lead post 116 is connected electrically in series to bus bar post 118 by heat rejection components 120. Heat rejection components 120 are electrically connected in parallel with one another between lead post 116 and bus bar post 118 for conducting current therebetween. In this respect heat rejection components 120 present multiple parallel current flow paths between lead post 116 and bus bar post 118. In the illustrated embodiment interconnect 110 has five heat rejection components with substantially the same conductivity, thereby apportioning current such that about 20% of current moving between lead post 116 and bus bar post 118 traverses each heat rejection component 120. It is to be understood that interconnect 110 can include fewer or more heat rejection components as suitable for an intended application.

Each heat rejection component 120 has an upper surface 122 and an opposed lower surface 124 (only one set of these surfaces identified in FIG. 4 for purposes of clarity). Upper surface 122 and lower surface 124 extend between lead post 116 and bus bar post 118 such that opposed upper and lower surfaces of adjacent heat rejection components 120 and portions of lead post 116 and bus bar post 118 define a plurality of respective coolant flow passage 126 (only one identified in FIG. 4 for clarity purposes) therebetween and extending through interconnect 110.

When contactor 102 is in the on-state, heat generated within housing 108 conducts out of housing 108 through power-consuming device lead 114, into lead post 116, and into heat rejection components 120. Heat rejection components 120 have a greater surface area than lead post 116 for a given electrical cross-section and therefore reject heat to ambient air in the vicinity of upper and lower surfaces 122 and 124, thereby dissipating a greater portion of the heat generated by contactor 102 than lead post 116. In embodiments, heat rejection components 120 reject substantially all heat generated by contactor 102 that is not dissipated to the ambient air through housing 108 and lead post 116. In certain embodiments, for environmental conditions where ambient air temperature of about 70 degrees Celsius during which interconnect 110 carries about 350 amps, interconnect 110 exhibits a voltage drop of about 150 millivolts and passively dissipates about 26 watts. Heat rejection can be further enhanced by active cooling, i.e. by forcing coolant through coolant flow passage 126.

In embodiments, interconnect 110 is formed from a plurality of relatively thin layers joined to one another. For illustration purposes, FIG. 4 shows a first layer 130 integrally connected to a second layer 132 and a third layer 136 by a weld 134. At least one of first layer 130 and second layer 132 can form respective portions of at least two of heat rejection component 120, lead post 116, and bus bar post 118. Third layer 136 can be integral with one of power consuming device lead 114 and power-consuming device bus bar 106 through weld 134. Weld 134 can be an ultrasonic weld formed using an ultrasonic welding process. Suitable examples of processes for joining layers to form interconnect 110 include high-power ultrasonic additive manufacturing (UAM) sonic welding processes, such as those available from Fabrisonic LLC. of Columbus, Ohio. UAM allows for integrally joining layers of dissimilar materials into integral structures having interleaved structures. In certain embodiments, posts and/or heat rejection components include sheets of copper or copper alloy materials with bus bars and/or contactor leads include sheets of aluminum or aluminum alloy materials ultrasonically welded to one another and interleaved to form an integral interconnect structure.

Figure 5:
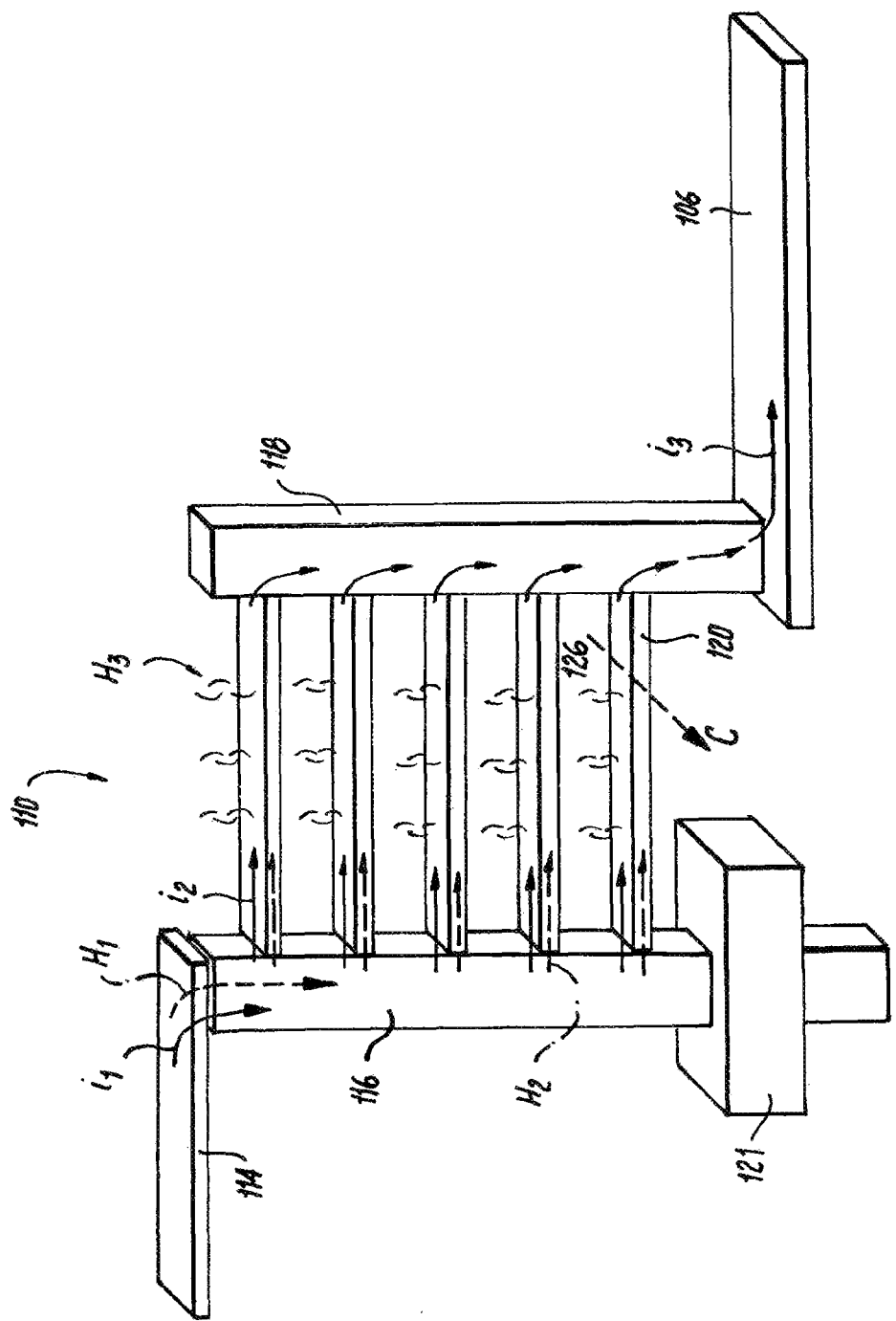
FIG. 5 is schematic side elevation view of the contactor, interconnect, and bus bar of FIG. 3, showing current, heat, and coolant flow through the interconnect.

With reference to FIG. 5, current, heat and coolant flows associated with interconnect 110 are shown. With respect to current, a first current flow $i_1$ (illustrated as a solid arrow) enters interconnect 110 through power-consuming device lead 114, traverses lead post 116, and forms a plurality of second current flows $i_2$ (illustrated as solid arrows) that respectively traverse heat rejection components 120. Second current flows $i_2$ flow to bus bar post 118, converge, and form a third current flow $i_3$ (illustrated as a solid line arrow) having similar magnitude as first current flow $i_1$.

Heat generated by current flowing through contactor 102 (shown in FIG. 3) conducts into power-consuming device lead 114 as a first heat flow $H_1$ (illustrated as a dashed arrow). First heat flow $H_1$ conducts from power-consuming device lead 114 into lead post 116. From lead post 116, first heat flow $H_1$ conducts into heat rejection components 120 as second heat flows $H_2$ (illustrated as dashed arrows). As second heat flow $H_2$ traverses respective heat rejection components 120 it radiates and/or convects into the surroundings of interconnect 110, thereby generating a third heat flows $H_3$ (illustrated with dashed arrows), thereby dissipating into the ambient environment. This allows for power-consuming device bus bar 106 to be formed from a material constrained only by an intended current flow instead of both current flow and heat rejection requirements, potentially allowing for use of aluminum or aluminum alloy materials (e.g. 6061 aluminum alloy) instead of heavier copper or copper alloy materials. This can potentially reduce the size and/or weight of the power distribution system.

Optionally, dissipation into the ambient environment can be with the assistance of a coolant flow C provided through coolant flow passage 126 between adjacent heat rejection components 120. This can increase the rate of heat dissipation into the ambient environment.

In embodiments, interconnect 110 forms a heat sink cooled by natural convection cooling of contactors without requiring additional cooling fans, thermal bridging, or heat sinks. This can allow for the use of lightweight contactors for high current applications without requiring fans, fan controllers or other additional components and weight. In certain embodiments, interconnect 110 provides power-consuming bus bar lead temperature reduction of about 90 degrees Celsius in comparison with conventional interconnect arrangements.

The methods and systems of the present disclosure, as described above and shown in the drawings, provide for power distribution systems with superior properties including improved thermal management. While the apparatus and methods of the subject disclosure have been shown and described with reference to preferred embodiments, those skilled in the art will readily appreciate that changes and/or modifications may be made thereto without departing from the spirit and scope of the subject disclosure.

What is claimed is:

1. An electrical interconnect for connecting a contactor with a bus bar, comprising:
   a lead post;
   a bus bar post in series with the lead post; and
   a plurality of electrically conductive heat rejection components extending between the lead post and the bus bar post, wherein the heat rejection components are arranged electrically in parallel with one another between the lead post and the bus bar post for passively dissipating heat conveyed from the lead post toward the bus bar post and conducting current between the lead post and the bus bar post,
   wherein heat from a lead connected to the lead post conducts into the lead post and to the heat rejection components from which the heat dissipates into the ambient environment.

2. An interconnect as recited in claim 1, wherein each heat rejection component includes an upper and a lower heat rejection surface extending between the lead post and bus bar post.

3. An interconnect as recited in claim 2, wherein the plurality of heat rejection components define at least one coolant flow passage between the heat rejection surfaces.

4. An interconnect as recited in claim 1, wherein at least one of the heat rejection components includes a first and a second layer extending between the lead post and the bus bar post, wherein the first layer is integral with the second layer.

5. An interconnect as recited in claim 4, wherein the first layer is ultrasonically welded to the second layer.

6. An interconnect as recited in claim 4, wherein the first and second layers extend into at least one of the lead post and the bus bar post.

7. An interconnect are recited in claim 6, further including a third layer integral with the heat rejection component first and second layers and forming a portion of the at least one of the lead post and bus bar post.

8. An interconnect as recited in claim 7, wherein the third layer connects the heat rejection component first and second layers with a bus bar.

9. An interconnect as recited in claim 7, wherein the third layer connects the heat rejection component first and second layer with a contactor lead.

10. An interconnect as recited in claim 7, wherein the third layer is formed from a material different from that forming the first and second layers.

11. An interconnect as recited in claim 7, wherein the third layer is ultrasonically welded to at least one of the first and second layers.

12. A power distribution system, comprising:
   a contactor with a lead; and
   an interconnect connected to the lead, wherein the interconnect includes:
   a lead post connected to the contactor lead;
   a bus bar post connected electrically connected in series with the lead post; and
   a plurality of passively cooled, electrically conductive heat rejection components extending between the lead post and the bus bar post, wherein the heat rejection components are arranged electrically in parallel with one another and between the lead post and the bus bar post for dissipating heat conveyed from the lead post toward the bus bar post while conducting current between the lead post and the bus bar post, wherein heat originating in the contactor conducts through the lead, into the lead post, and to the heat rejection components, from which the heat dissipates into the ambient environment.

13. A power distribution system as recited in claim 12, wherein the lead is a first phase lead, the interconnect is a first phase interconnect, the bus bar post is a first phase bus bar post, and further including a second phase interconnect coupling a second phase contactor lead to a second phase bus bar lead.

14. A power distribution system as recited in claim 12, further including a bus bar connected to the bus bar post.

15. A power distribution system as recited in claim 14, wherein the contactor is ultrasonically welded to the bus bar through the interconnect.

* * * * *